United States Patent
Zhang et al.

(10) Patent No.: US 11,652,040 B2
(45) Date of Patent: May 16, 2023

(54) SEMICONDUCTOR DEVICE, METHOD OF MANUFACTURING SEMICONDUCTOR DEVICE, AND MODULE

(71) Applicant: ROHM CO., LTD., Kyoto (JP)

(72) Inventors: Bin Zhang, Kyoto (JP); Akinori Nii, Kyoto (JP); Taro Nishioka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 88 days.

(21) Appl. No.: 16/867,266

(22) Filed: May 5, 2020

(65) Prior Publication Data
US 2020/0365505 A1    Nov. 19, 2020

(30) Foreign Application Priority Data
May 13, 2019    (JP) .............................. JP2019-090478

(51) Int. Cl.
*H01L 23/498* (2006.01)
*H01L 23/31* (2006.01)
*H01L 21/48* (2006.01)

(52) U.S. Cl.
CPC ...... *H01L 23/49861* (2013.01); *H01L 21/485* (2013.01); *H01L 23/3121* (2013.01); *H01L 23/49866* (2013.01)

(58) Field of Classification Search
CPC ........... H01L 23/49861; H01L 23/3121; H01L 23/49866; H01L 21/485
See application file for complete search history.

(56) References Cited

U.S. PATENT DOCUMENTS

| | | | | |
|---|---|---|---|---|
| 5,784,260 A | * | 7/1998 | Fuller, Jr. | H01L 23/24 361/783 |
| 6,143,981 A | * | 11/2000 | Glenn | H01L 23/49548 257/676 |
| 6,794,738 B2 | * | 9/2004 | Mahle | H01L 23/3142 257/667 |
| 6,812,552 B2 | * | 11/2004 | Islam | H01L 21/4832 257/784 |
| 2009/0178828 A1 | * | 7/2009 | Tsumura | H01L 24/81 427/98.6 |
| 2018/0190577 A1 | | 7/2018 | Gupta et al. | |
| 2019/0074242 A1 | | 3/2019 | Watanabe et al. | |

FOREIGN PATENT DOCUMENTS

| | | |
|---|---|---|
| JP | 2009302209 A | 12/2009 |
| JP | 2016105432 A | 6/2016 |
| JP | 2017212290 A | 11/2017 |
| JP | 2019047064 A | 3/2019 |
| WO | 2019060496 A1 | 3/2019 |

OTHER PUBLICATIONS

Office Action issued in Japanese Patent Application No. 2019090478, dated Mar. 14, 2023, with English machine translation, 8 pages provided.

* cited by examiner

*Primary Examiner* — Peniel M Gumedzoe
(74) *Attorney, Agent, or Firm* — Hamre, Schumann, Mueller & Larson, P.C.

(57) ABSTRACT

There is provided a semiconductor device including: a lead frame including a first opening portion; a resin filled in the first opening portion; and a semiconductor element electrically connected to the lead frame, wherein a side wall surface of the lead frame in the first opening portion has a larger average surface roughness than an upper surface of the lead frame.

18 Claims, 14 Drawing Sheets

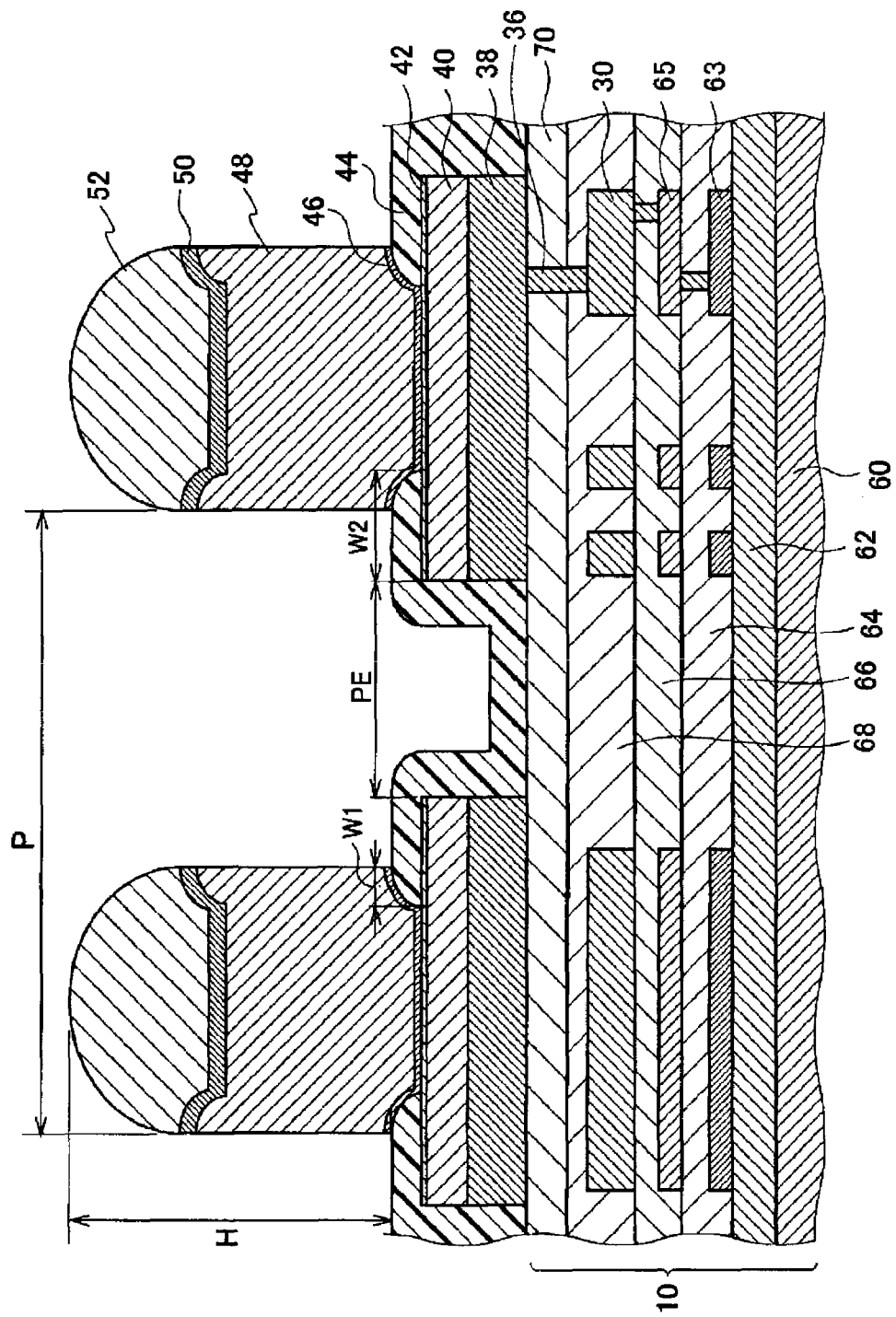

US 11,652,040 B2

SEMICONDUCTOR DEVICE, METHOD OF MANUFACTURING SEMICONDUCTOR DEVICE, AND MODULE

CROSS-REFERENCE TO RELATED APPLICATION

This application is based upon and claims the benefit of priority from Japanese Patent Application No. 2019-090478, filed on May 13, 2019, the entire contents of which are incorporated herein by reference.

TECHNICAL FIELD

The present disclosure relates to a semiconductor device, a method of manufacturing the semiconductor device, and a module.

BACKGROUND

In recent years, as design rules of semiconductor devices have been reduced and wafer processes have been greatly changed, semiconductor packages are required to be smaller, thinner, cheaper in price, and the like. Methods for mounting a chip in a semiconductor package on a substrate are roughly classified into wire bonding and flip chip bonding. In particular, the flip chip bonding is attracting attention because it is suitable for high densification and high integration of chips.

The flip chip bonding is a method of electrically connecting a chip surface and a substrate by using terminals having a protruding shape arranged in an array without using wires such as in the wire bonding. As compared with the wire bonding, the flip chip bonding does not require a wiring space for wires, so that the package itself can be made smaller.

Since a chip mounted on a substrate using the flip chip bonding is vulnerable to external stress and the like, the chip is protected by sealing with a resin. However, due to insufficient adhesion between the resin and a lead frame, there is a problem that voids and solder cracks are generated near the interface between the resin and the lead frame or the terminals having the protruding shape. The voids and solder cracks increase the resistance value of a bonding portion, and the heat generated by the resistance may cause a semiconductor device to malfunction.

SUMMARY

Some embodiments of the present disclosure provide a semiconductor device, which is capable of sufficiently securing adhesion between a resin and a lead frame without causing voids or solder cracks, a method of manufacturing the same, and a module including the semiconductor device.

According to one embodiment of the present disclosure, there is provided a semiconductor device including: a lead frame including a first opening portion; a resin filled in the first opening portion; and a semiconductor element electrically connected to the lead frame, wherein a side wall surface of the lead frame in the first opening portion has a larger average surface roughness than an upper surface of the lead frame.

According to another embodiment of the present disclosure, there is provided a module including the semiconductor device.

According to further embodiment of the present disclosure, there is provided a method of manufacturing a semiconductor device, including: performing roughening treatment on a lead frame including a first opening portion; forming a pillar on a semiconductor substrate; bonding the pillar to the lead frame; and filling the first opening portion with a resin.

BRIEF DESCRIPTION OF DRAWINGS

The accompanying drawings, which are incorporated in and constitute a part of the specification, illustrate embodiments of the present disclosure.

FIG. 9 is a schematic cross-sectional view of a semiconductor device according to an embodiment of the present disclosure.

DETAILED DESCRIPTION

Figure 1:
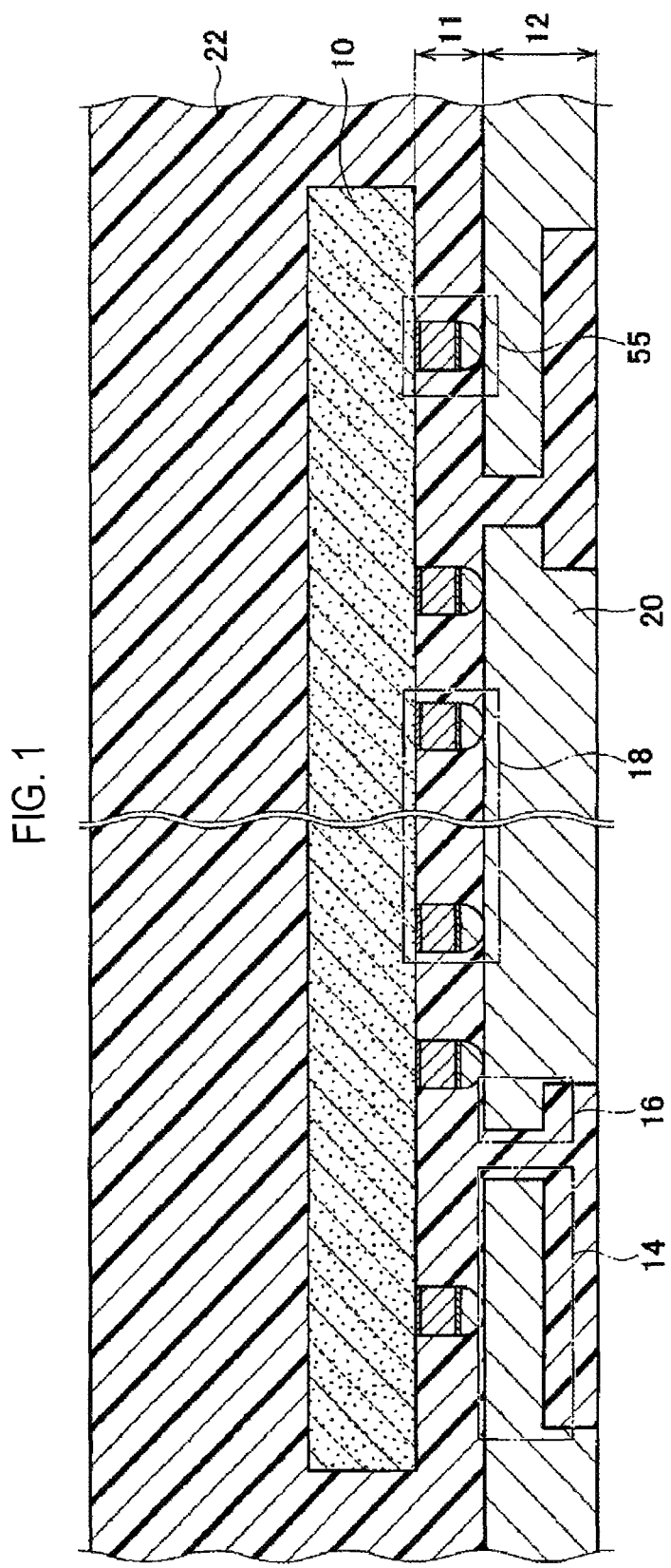
FIG. 1 is a schematic cross-sectional view of a semiconductor device according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Some embodiments will be now described with reference to the drawings. Throughout the drawings, the same or similar parts are denoted by the same or similar reference numerals. However, it should be noted that the drawings are schematic and the relationship between the thickness and the planar dimension of each part is different from the actual one. Therefore, specific thicknesses and dimensions should be determined in consideration of the following description. In addition, it is needless to say that the drawings include portions having different dimensional relationships and ratios.

The following embodiments exemplify an apparatus or method for embodying the technical ideas of the present disclosure, and do not specify the material, shape, structure, arrangement, etc. of each constituent part. Various modifications may be made to the embodiments within the scope of the claims.

FIG. 1 is a schematic cross-sectional view of a semiconductor device according to an embodiment of the present disclosure. The semiconductor device shown in FIG. 1 includes a region 12 including a lead frame 20, a region 11 including a pillar 55, and a semiconductor substrate 10. The lead frame 20 includes an opening portion, and the side wall surface of the lead frame 20 in the opening portion has a larger average surface roughness than the upper surface of the lead frame 20 (the interface between the regions 11 and 12 in the drawing). In addition, the lead frame 20 is electrically connected to a semiconductor element included in the semiconductor substrate 10 via the pillar 55. Further, the lead frame 20, the pillar 55, and the semiconductor substrate 10 are covered and sealed with a resin 22.

Here, a region 14 including the side wall surface of the lead frame 20 and a region 16 including the upper surface of the lead frame 20 in the opening portion of the lead frame 20 shown in FIG. 1 will be described with reference to FIGS. 2A, 2B, 3A, and 3B.

Figure 2A:
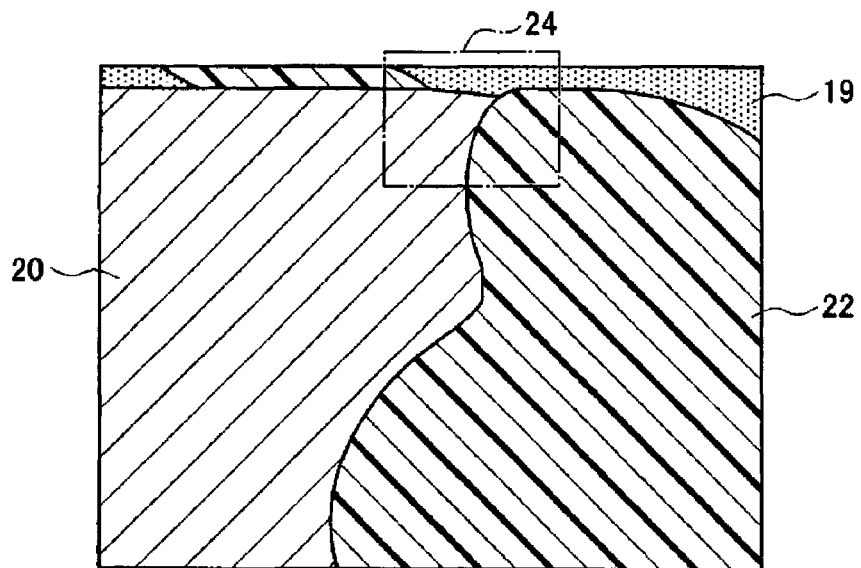
FIGS. 2A and 2B are a schematic cross-sectional view of a periphery of a lead frame and an enlarged cross-schematic sectional view of the periphery of the lead frame, respectively, in a semiconductor device according to an embodiment of the present disclosure.
Figure 2B:
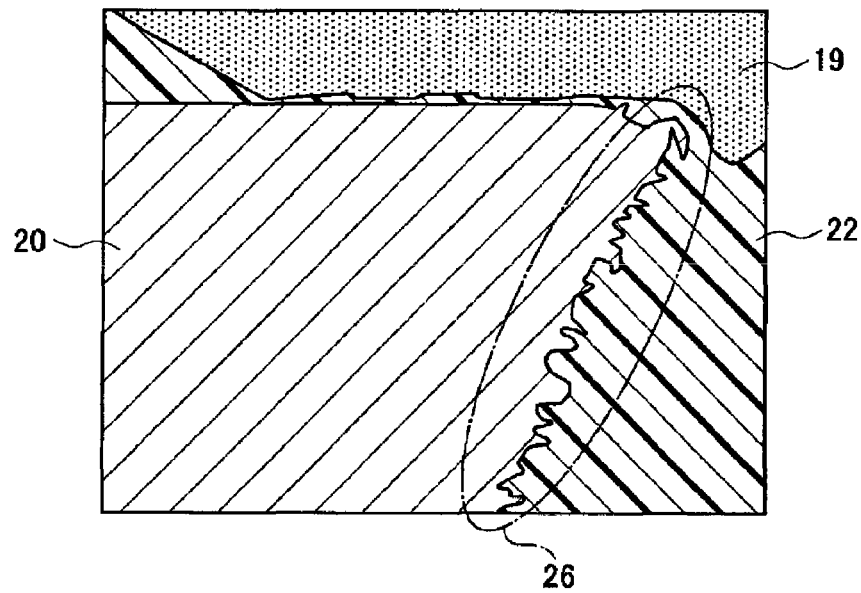

FIG. 2A is a schematic cross-sectional view of a periphery of the lead frame 20 in the region 14, and FIG. 2B is an enlarged view of a region 24 shown in FIG. 2A. As shown in FIG. 2A, the opening portion of the lead frame 20 is filled with the resin 22. Solder 19 for bonding to the pillar 55 is formed on the lead frame 20. As will be described in detail below, the opening portion includes a first region having a first opening width and a second region having a second opening width narrower than the first opening width.

Further, as shown in FIG. 2B, the side wall surface of the lead frame 20 in a region 26 is roughly shaved by roughening treatment, and the details of the roughened side wall surface are filled with the resin 22. The resin 22 penetrates into the fine concavo-convex portions on the side wall surface of the lead frame 20 and is hardened, thereby improving the adhesion (also referred to as an anchor effect).

Examples of the roughening treatment may include sandblasting, a method of applying a roughening solution, and a method of immersing in a roughening solution. The average surface roughness of the roughened side wall surface is preferably, for example, 2 to 5 μm. The average surface roughness can be determined in accordance with, for example, JIS B 0601: 2013 or ISO 25178.

Figure 3A:
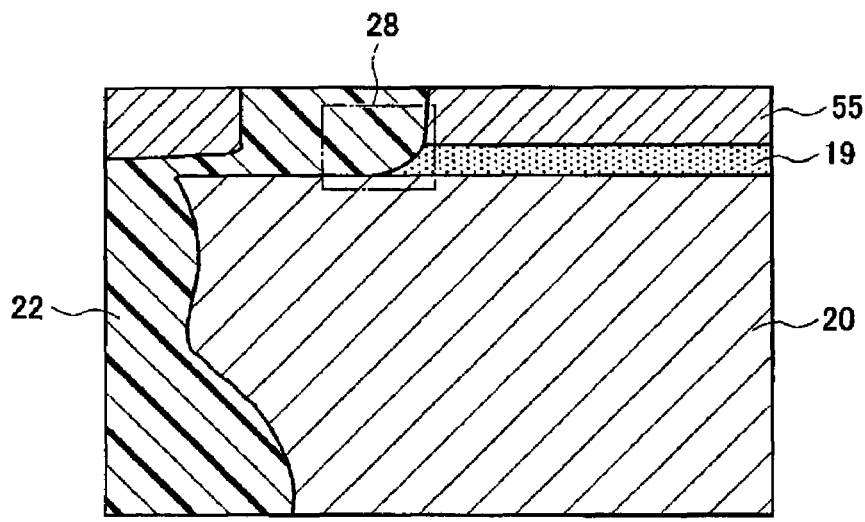
FIGS. 3A and 3B are a schematic cross-sectional view of a periphery of a lead frame and an enlarged schematic cross-sectional view of the periphery of the lead frame, respectively, in a semiconductor device according to an embodiment of the present disclosure.
Figure 3B:
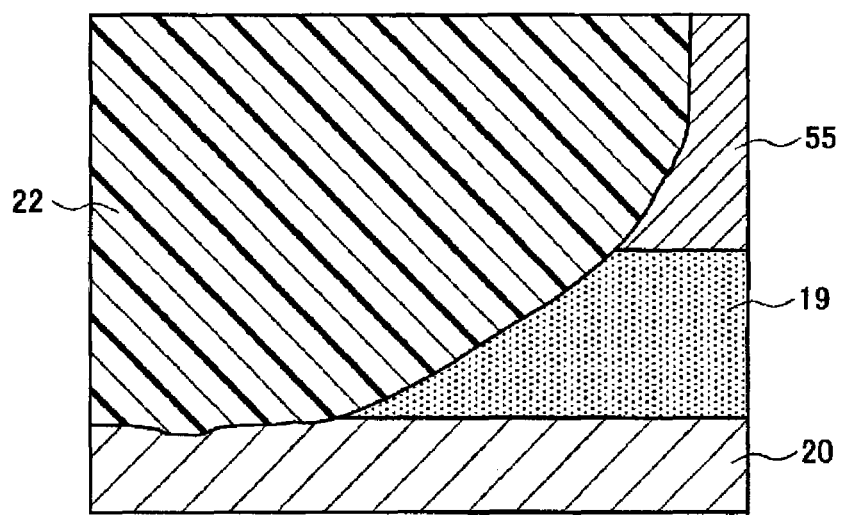

FIG. 3A is a schematic cross-sectional view of the periphery of the lead frame 20 in the region 16 subjected to a thermal cycle test, and FIG. 3B is an enlarged view of a region 28 shown in FIG. 3A. The solder 19 for bonding to the pillar 55 is formed on the lead frame 20. A heat treatment process tends to cause the resin 22 to peel off from the lead frame 20 or to promote solder cracks. However, according to one embodiment of the present disclosure, since the adhesion between the lead frame 20 and the resin 22 is sufficiently secured by the above-described anchor effect, it is possible to prevent generation of voids and solder cracks even on the upper surface of the lead frame 20, as shown in FIG. 3B.

FIGS. 4A, 4B, 5A, and 5B are schematic cross-sectional views of a periphery of a lead frame in which a side wall surface in an opening portion is not subjected to roughening treatment, as a comparative example of a semiconductor device according to the present embodiment.

Figure 4A:
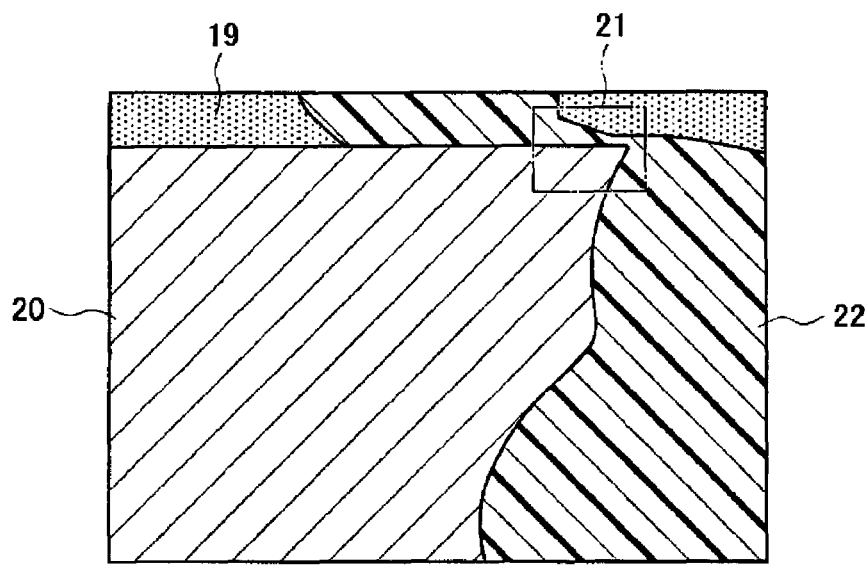
FIGS. 4A and 4B are a schematic cross-sectional view of a periphery of a lead frame and an enlarged schematic cross-sectional view of the periphery of the lead frame, respectively, in a semiconductor device according to a comparative example.
Figure 4B:
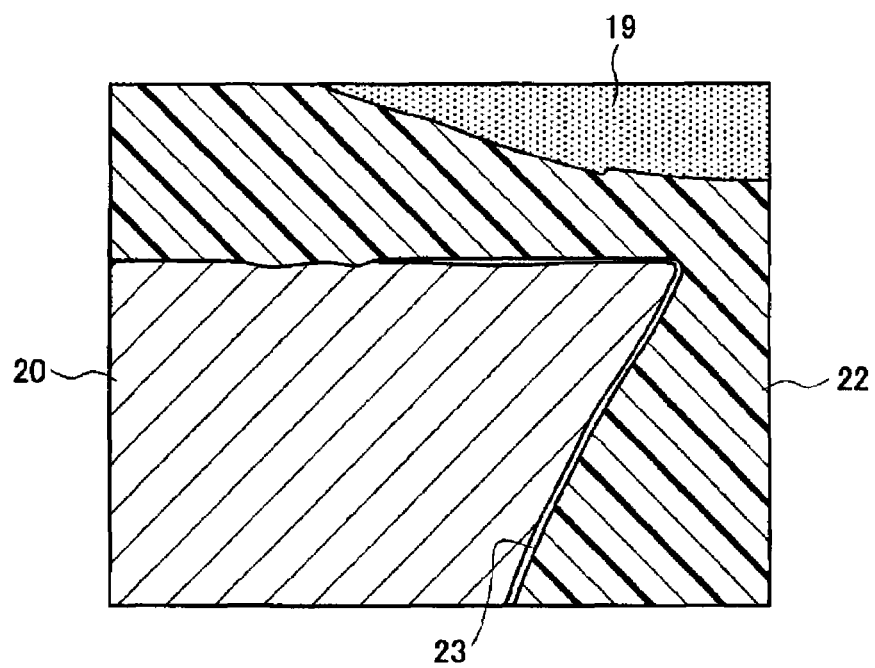

FIG. 4A is a schematic cross-sectional view of the periphery of the lead frame 20 in the region 14 when the side wall surface in the opening portion is not subjected to the roughening treatment, and FIG. 4B is an enlarged view of a region 21 shown in FIG. 4A. As shown in FIG. 4B, since the adhesion between the lead frame 20 and the resin 22 is insufficient, a void 23 is generated between the lead frame 20 and the resin 22.

Figure 5A:
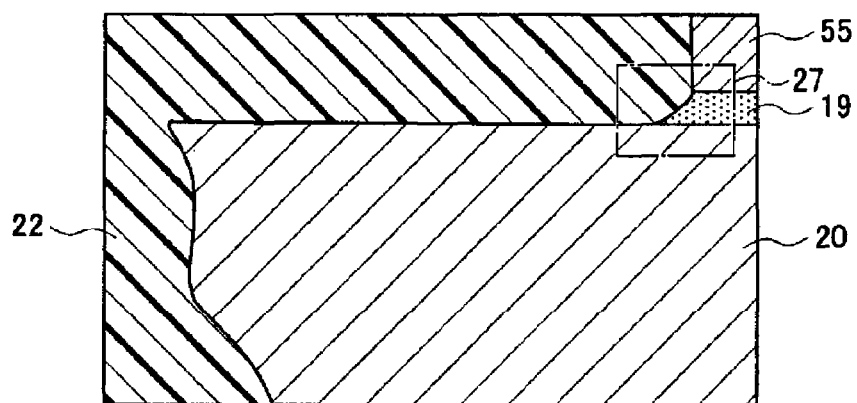
FIGS. 5A and 5B are a schematic cross-sectional view of a periphery of a lead frame and an enlarged schematic cross-sectional view of the periphery of the lead frame, respectively, in a semiconductor device according to a comparative example.
Figure 5B:
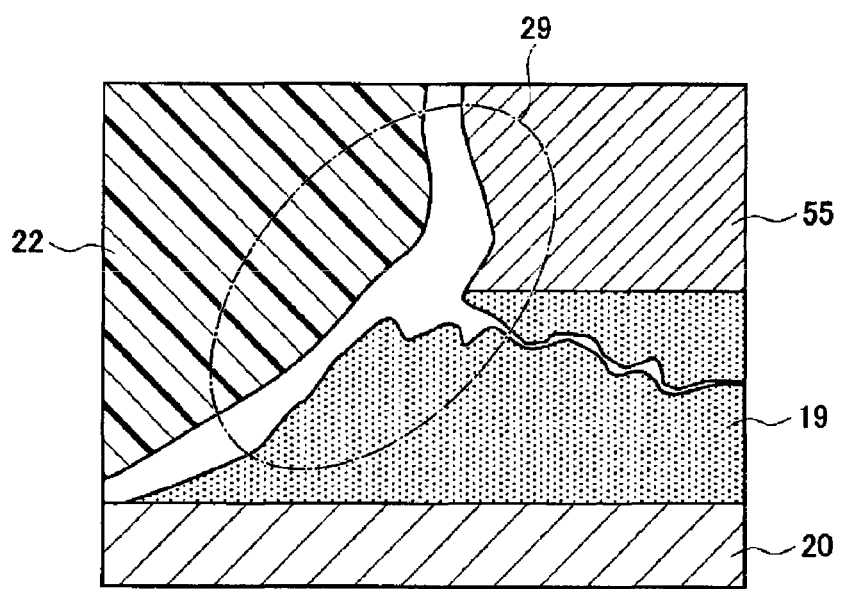

FIG. 5A is a schematic cross-sectional view of the periphery of the lead frame 20 in the region 16 when the side wall surface in the opening portion is not subjected to the roughening treatment after a thermal cycle test is performed. FIG. 5B is an enlarged view of a region 27 shown in FIG. 5A. As shown in FIG. 5B, since the adhesion between the lead frame 20 and the resin 22 is insufficient, a void is generated between the lead frame 20 and the resin 22 in a region 29, and solder cracks are generated near the solder 19 that bonds the lead frame 20 and the pillar 55.

Therefore, by providing the lead frame 20 including the roughened side wall surface, the adhesion between the lead frame 20 and the resin 22 is sufficiently secured by the anchor effect, thereby preventing the generation of voids and solder cracks. As a result, defects in the semiconductor device can be reduced.

The lead frame 20 may be made of, for example, copper, a copper alloy such as copper-tin alloy, a copper-zirconium alloy, a copper-iron alloy or a copper-chromium-tin-zinc alloy, an iron-nickel alloy, stainless steel, or the like. The iron-nickel alloy is preferable because it has a thermal expansion coefficient close to that of silicon and little damage is done to a die bonding agent that bonds a chip made of silicone or the like to a die pad even in a heat treatment process or the like, and is advantageous when a large chip is mounted. Further, copper or the copper alloy has lower electric resistance and thermal resistance than the iron-nickel alloy and is suitable for products requiring a high-speed operation. Since the thermal expansion coefficient of copper or the copper alloy is close to that of the resin 22, it is advantageous in mounting a large package or a small chip and is suitable for a microcomputer, a system LSI, and the like.

[Method of Manufacturing Lead Frame]

Figure 6A:
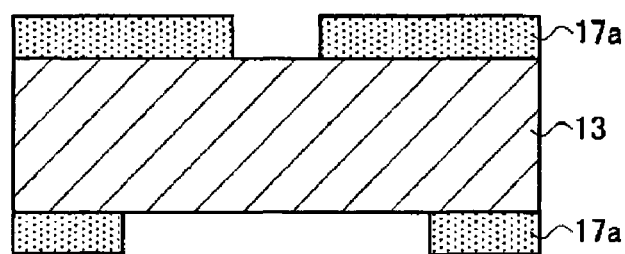
FIGS. 6A to 6E are views for explaining a method of manufacturing a lead frame with FIG. 6A showing a process of forming resist masks with a pattern on the upper and lower surfaces of a metal plate, FIG. 6B showing a process of forming an opening portion in the metal plate, FIG. 6C showing a process of forming a protective seal, FIG. 6D showing a process of performing roughening treatment, and FIG. 6E showing a process of removing the protective seal.
Figure 6B:
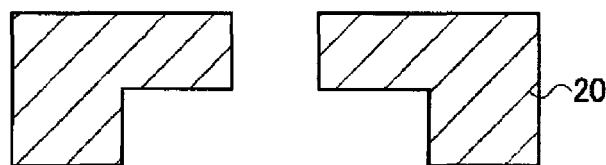

An example of a method of manufacturing a lead frame in the semiconductor device according to the present embodiment will be described. First, as shown in FIG. 6A, a metal plate 13 is prepared. Resist masks 17a are formed with a pattern on the upper and lower surfaces of the metal plate 13, respectively, and an opening portion is formed in the metal plate 13 by etching or the like using the resist masks 17a as masks. Thereafter, as shown in FIG. 6B, the resist masks 17a are removed, thereby providing a metal plate, in which the opening portion is formed, as the lead frame 20. The metal plate 13 may be made of, for example, the same material as the lead frame described above. The thickness of the metal plate 13 may be, for example, about 100 to 200 μm.

Figure 6C:
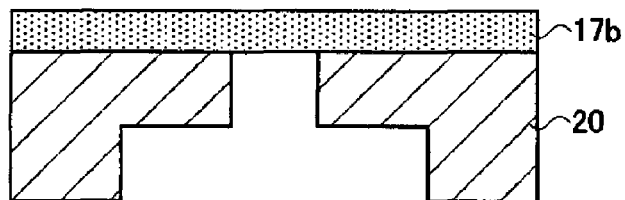

Next, as shown in FIG. 6C, a protective seal 17b is formed on the lead frame 20. The protective seal 17b may be made of, for example, polysilicon or silicon oxide.

Figure 6D:
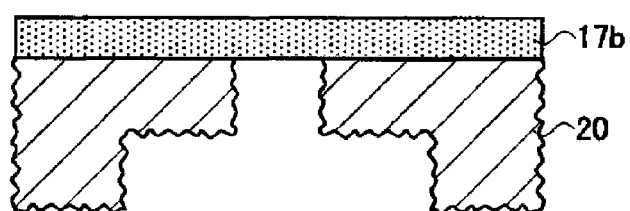
Figure 6E:
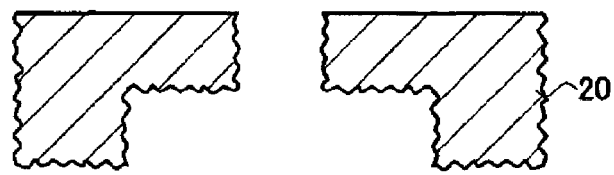

Next, as shown in FIG. 6D, the lead frame 20 is subjected to roughening treatment, and then, as shown in FIG. 6E, the protective seal 17b is removed to manufacture the lead frame 20. When the roughening treatment is performed, since the protective seal 17b is disposed on the lead frame 20, the upper surface of the lead frame 20 is not roughened by the roughening treatment. The upper surface of the lead frame 20 is preferably not roughened in order to secure the bonding strength with the solder. By making a configuration in which only the side wall surface of the lead frame in the opening portion is roughened by the roughening treatment, it is possible to secure the bonding strength between the lead frame and the solder by suppressing the diffusion of the solder while securing the adhesion between the lead frame and the resin.

Figure 7A:
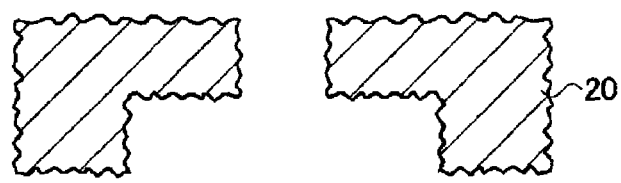
FIGS. 7A and 7B are views for explaining a method of manufacturing a lead frame with FIG. 7A showing a process of performing roughening treatment and FIG. 7B showing a process of flattening a surface.
Figure 7B:
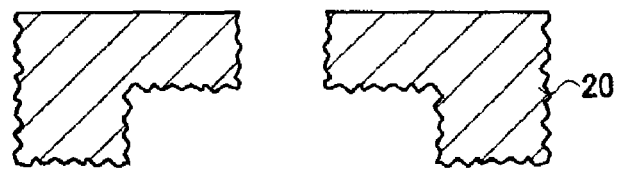

When the lead frame 20 is subjected to the roughening treatment, after the resist masks are removed, as shown in FIG. 7A, the side wall surface and the upper surface of the opening portion may be roughened without using the protective seal 17b, and thereafter, as shown in FIG. 7B, the roughened surfaces may be polished or tapped to be flattened with respect to an upper surface which does not need to be roughened. Further, when the roughening of the upper surface of the lead frame does not significantly contribute to the bonding strength between the lead frame and the solder, the process of flattening the roughened surface may not be performed.

The lead frame may be manufactured by punching the metal plate after the roughening treatment.

Figure 8:
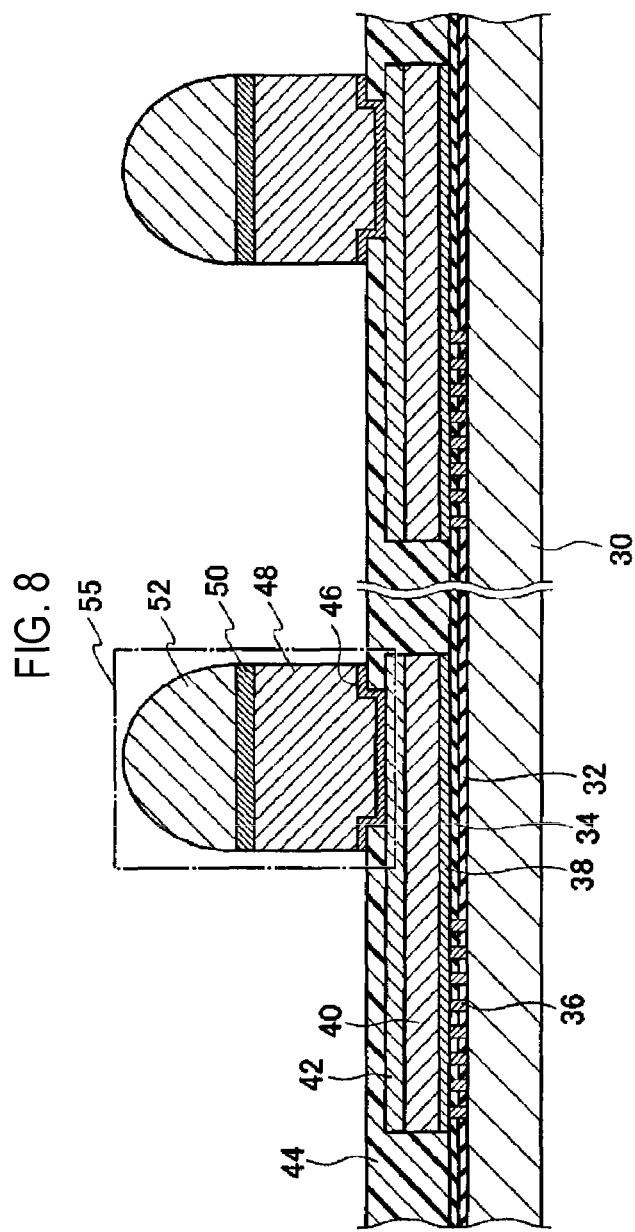
FIG. 8 is a schematic cross-sectional view of a semiconductor device according to an embodiment of the present disclosure.

The region 11 including the pillar 55 in FIG. 1 will be described with reference to FIG. 8. An insulating layer 32 and an insulating layer 34 are formed on a metal layer 30, and a metal layer 38, a metal layer 40, and a metal layer 42 are formed on the insulating layer 34. The metal layer 38 is electrically connected to the metal layer 30 via plugs 36 formed in the insulating layers 32 and 34. Further, a resin 44 that covers the insulating layer 34 and the metal layer 42 is formed. The pillar 55 is formed of a laminate of a metal layer 46, a metal layer 48, a metal layer 50, and a metal layer 52, and is electrically connected to the metal layer 42 via an opening portion formed in the resin 44. The thin metal layer 46 constituting the pillar 55 functions as a seed layer.

Here, the pillar 55 will be described with reference to FIG. 9.

An overlap W1 between the end of the resin 44 and the pillar 55 is, for example, 5 to 20 μm. An overlap W2 between the resin 44 and the metal layer 38 (or the metal layer 40 or the metal layer 42) is, for example, 15 to 35 μm.

Two or more pillars 55 may be arranged. For example, the pillars may be designed with various arrangements such as 3 rows×4 columns arrangement (12 pillars), 3 rows×5 columns arrangement (15 pillars), 5 rows×5 columns arrangement (25 pillars), arrangement of pillars only in the peripheral portion in the 3 rows×5 columns arrangement (arrangement of 12 pillars), arrangement of pillars only in the peripheral portion and the central portion in the 5 rows×5 columns arrangement (e.g., arrangement of 19 or 21 pillars), etc.

Further, it is preferable that a pitch interval P between one of the pillars 55 and the other one of the pillars 55 closest to it is, for example, 150 to 250 μm, because the bonding area and the bonding strength with the lead frame 20 increase.

Further, similarly to the pillar 55, two or more metal layers 38 (and metal layers 40 and 42) on which the pillars 55 are arranged may be formed. The number of metal layers 38 and the number of pillars 55 may be the same or different. For example, two pillars 55 may be arranged on one metal layer 38. A distance PE between one of the metal layers 38 and the other closest one of the metal layers 38 is, for example, 10 to 100 μm.

The pillar 55 may contain at least one selected from the group of copper, nickel, tin, and silver. For example, copper may be used for the metal layers 46 and 48, nickel may be used for the metal layer 50, and a tin-silver alloy may be used for the metal layer 52.

The width of the pillar 55 is, for example, 50 to 200 μm, and the total thickness of the metal layers 46 and 48 constituting the pillar 55 is, for example, 35 to 45 μm. The thickness of the metal layer 50 constituting the pillar 55 is, for example, 2 to 5 μm, and the thickness of the metal layer 52 constituting the pillar 55 is, for example, 15 to 30 μm. Further, the height H of the pillar 55 is, for example, 55 to 75 μm.

The metal layer 38, the metal layer 40 and the metal layer 42 may independently contain at least one selected from the group of copper, silver, gold, nickel, and palladium, and may have either a single layer structure or a laminated structure. For example, copper may be used for the metal layer 38, nickel may be used for the metal layer 40, and palladium may be used for the metal layer 42. Further, the thickness of the metal layer 38 and the thickness of the metal layer 40 may be independently set to, for example, about 1 to 10 μm, and the thickness of the metal layer 40 may be set to, for example, about 0.05 to 2 μm. The thickness of the metal layer 42 may be thinner than those of the metal layer 38 and the metal layer 40 from the viewpoint of adhesion with the upper layer.

A thermosetting resin such as a polyimide resin or the like may be used for the resin 44. Further, it is preferable to round the end portion of the resin 44, because the coverage of the metal layer 46 at the end portion of the resin 44 can be improved when the metal layer 46 is formed.

The semiconductor substrate 10 is disposed below the pillar 55 and the metal layer 38. The semiconductor substrate 10 includes a semiconductor element layer 60 including a semiconductor element, an interlayer insulating layer 62, a wiring layer 63, an insulating layer 64, a wiring layer 65, an insulating layer 66, a metal layer 30, an insulating layer 68, an insulating layer 70, and a plug 36. The pillar 55 is electrically connected to the semiconductor element in the semiconductor element layer 60 via the metal layer 42, the metal layer 40, the metal layer 38, the plug 36, the metal layer 30 functioning as a wiring layer, the wiring layer 65, the wiring layer 63, and so on. The insulating layer 68, the insulating layer 70, and the metal layer 30 may include the configuration (the insulating layer 32, the insulating layer 34, and the metal layer 30) as illustrated in FIG. 8.

The interlayer insulating layer 62, the insulating layer 64, the insulating layer 66, the insulating layer 68, and the insulating layer 70 may be independently made of silicon oxide, silicon nitride, aluminum oxide, zirconium oxide, tantalum oxide, or the like and may have either a single layer structure or a laminated structure. The insulating layer 70 is preferably made of silicon nitride or aluminum oxide having a function of blocking diffusion of impurities.

The wiring layer 63, the wiring layer 65, the metal layer 30 and the plug 36 may be independently made of at least one selected from the group of tungsten, titanium, aluminum, copper, an aluminum alloy, and a copper alloy and may have either a single layer structure or a laminated structure.

[Method of Manufacturing Semiconductor Device]

A method of manufacturing a semiconductor device with a structure including a semiconductor substrate 10, a pillar 55, and so on formed on a lead frame 20 will be now described.

Figure 10A:
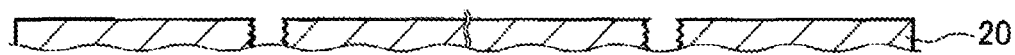
FIGS. 10A to 10D are views for explaining a method of manufacturing a semiconductor device according to an embodiment of the present disclosure with FIG. 10A showing a process of performing roughening treatment on a side wall surface of a lead frame, FIG. 10B showing a process of forming a pillar on a semiconductor substrate, FIG. 10C showing a process of stacking the semiconductor substrate and the pillar on a lead frame, and FIG. 10D showing a process of sealing with a resin.
Figure 10B:
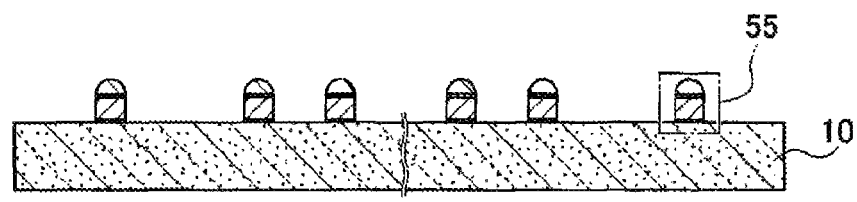
Figure 10C:
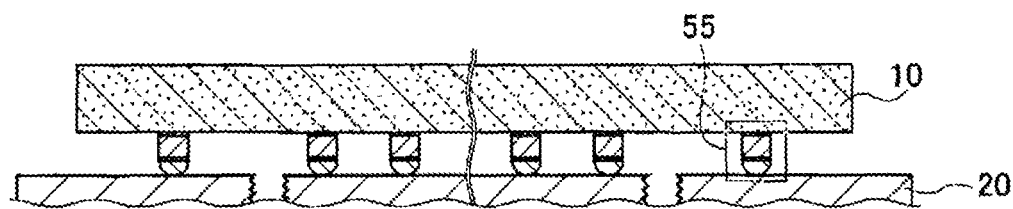

First, as shown in FIG. 10A, an opening portion is formed in each lead frame 20, and the side wall surface in the opening portion is roughened by roughening treatment. Next, as shown in FIG. 10B, pillars 55 are formed on the semiconductor substrate 10. Next, as shown in FIG. 10C, a structure including the semiconductor substrate 10 and the pillars 55 is stacked on each lead frame 20 in a face-down state in which the structure is turned upside down. Specifically, electrode terminals of semiconductor elements included in the semiconductor substrate 10 are bonded and electrically connected to the respective lead frames 20 via the pillars 55 and solder.

Figure 10D:
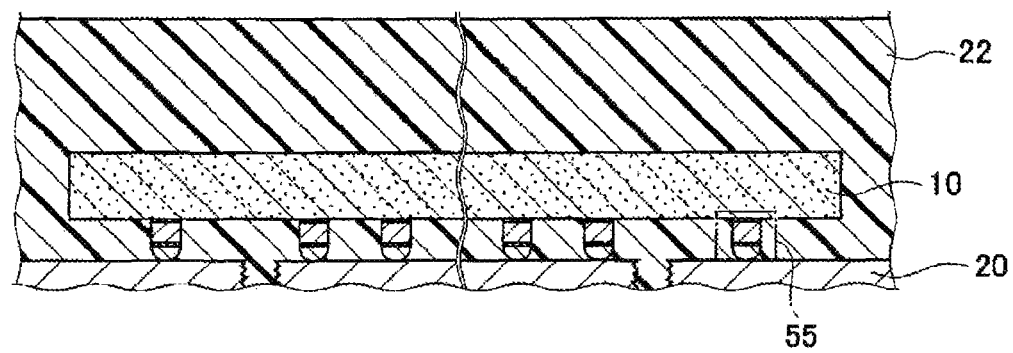

Next, as shown in FIG. 10D, the lead frames 20, the semiconductor substrate 10, and the pillars 55 are sealed with a resin 22. The resin 22 is filled in the roughened opening portion. An example of the resin 22 to be used may include a mold resin obtained by containing a filler in an epoxy resin. The resin 22 may be formed by, for example, a transfer molding method or a compression molding method. The resin 22 may be formed to expose the entire back surface of the semiconductor substrate 10 or may be formed to cover a part or all of the back surface of the semiconductor substrate 10.

As the resin 22 enters the fine concavo-convex portions of the side wall surface of the lead frame 20 and is cured and sealed, the adhesion between the lead frame 20 and the resin 22 is sufficiently ensured, thereby preventing generation of voids and solder cracks. Thus, defects in the semiconductor device can be reduced.

Next, a plurality of semiconductor devices are completed by cutting the lead frames 20, the semiconductor substrate 10, the pillars 55, and so on, which are sealed with the resin 22, into individual pieces. The cutting may be performed by, for example, a slicer or the like.

Through the above-described steps, a semiconductor device including a lead frame having a roughened side wall surface can be obtained.

[Module Layout]

Figure 11:
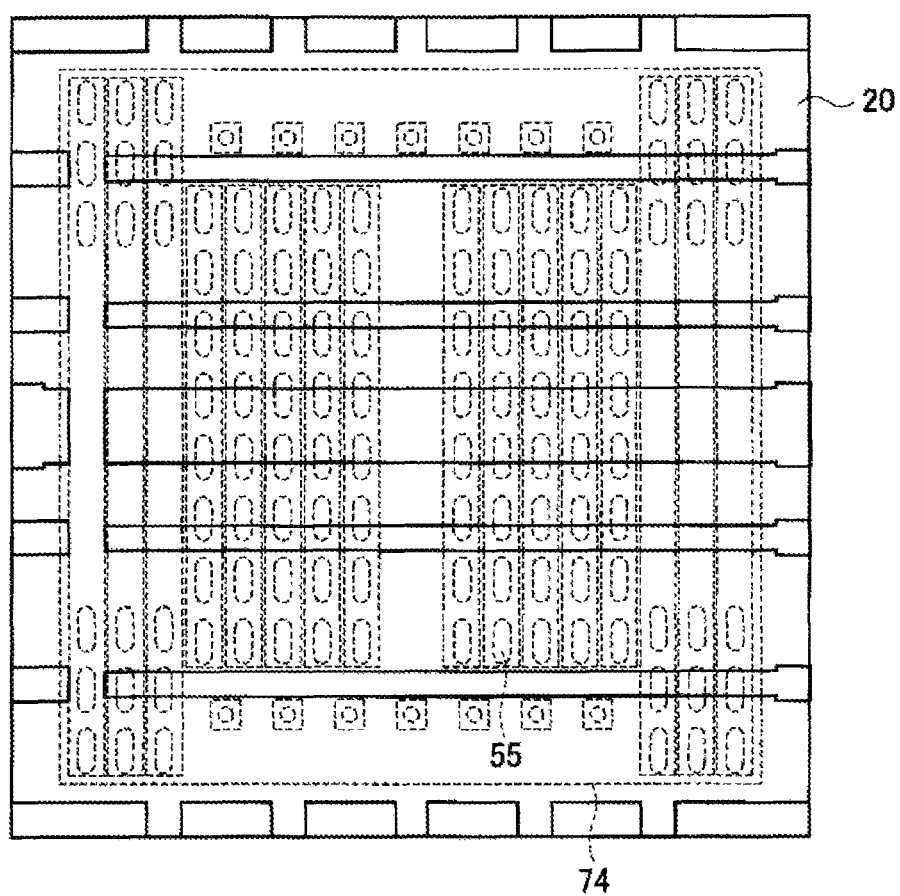
FIG. 11 is a layout diagram of a module including a semiconductor device according to an embodiment of the present disclosure.

FIG. 11 is a layout diagram of a module including a semiconductor device according to an embodiment of the present disclosure. The semiconductor device (a semiconductor chip 74) in the module includes a lead frame 20 and pillars 55.

Figure 12:
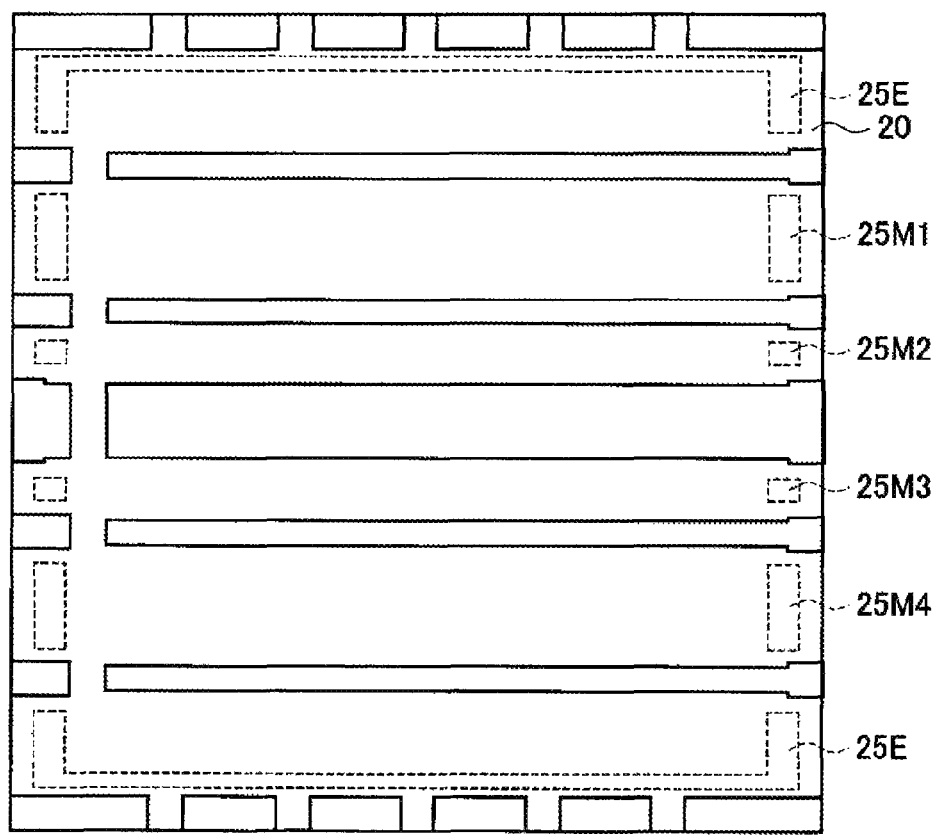
FIG. 12 is a layout diagram of a module including a semiconductor device according to an embodiment of the present disclosure.

FIG. 12 is a layout diagram of a module in which some parts of the configuration in FIG. 11 are omitted. The outer end portion of the module is surrounded by opening portions 25 (25E, 25M1, 25M2, 25M3, 25M4, etc.) formed in the lead frame 20. Each opening portion 25 is configured to store a resin 22. By forming the opening portions 25, it is possible to suppress overflow of the resin and to uniformly apply and form the resin. The opening portion 25 is not particularly limited in its shape, but may be preferably rounded because the resin 22 can be filled into the details of the opening portion.

Figure 13:
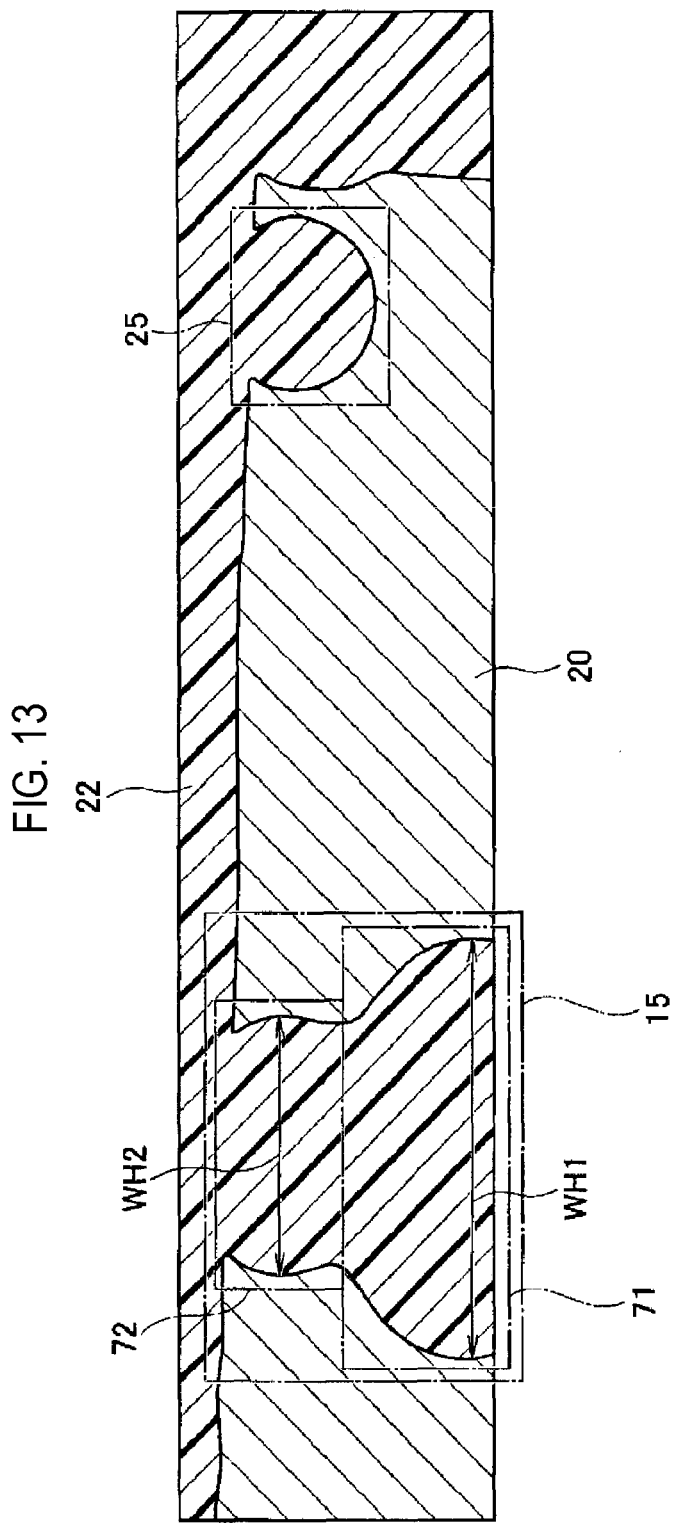
FIG. 13 is a schematic cross-sectional view of an outer end portion of a lead frame in a semiconductor device according to an embodiment of the present disclosure.

The side wall surface of an opening portion 15 shown in FIG. 13 is roughened by roughening treatment. The opening portion 15 includes a first region 71 having a first opening width WH1 and a second region 72 having a second opening width WH2 smaller than the first opening width WH1. The first region 71 is located above the second region 72. The depth of an opening portion 25 is smaller than that of the opening portion 15 and is, for example, 80 to 100 μm. Further, the opening portion 25 is located closer to the outer end portion of the lead frame 20 than the opening portion 15, and contributes to the suppression of the overflow of the resin and the uniform application and formation of the resin as described above.

Since the opening portion 25 and the second region 72 of the opening portion 15 can be formed simultaneously, the depth of the opening portion 25 is the same as the depth of the second region 72. As used in the present disclosure, the term "same" includes a value within a range of ±5%.

[Package]

Figure 14A:
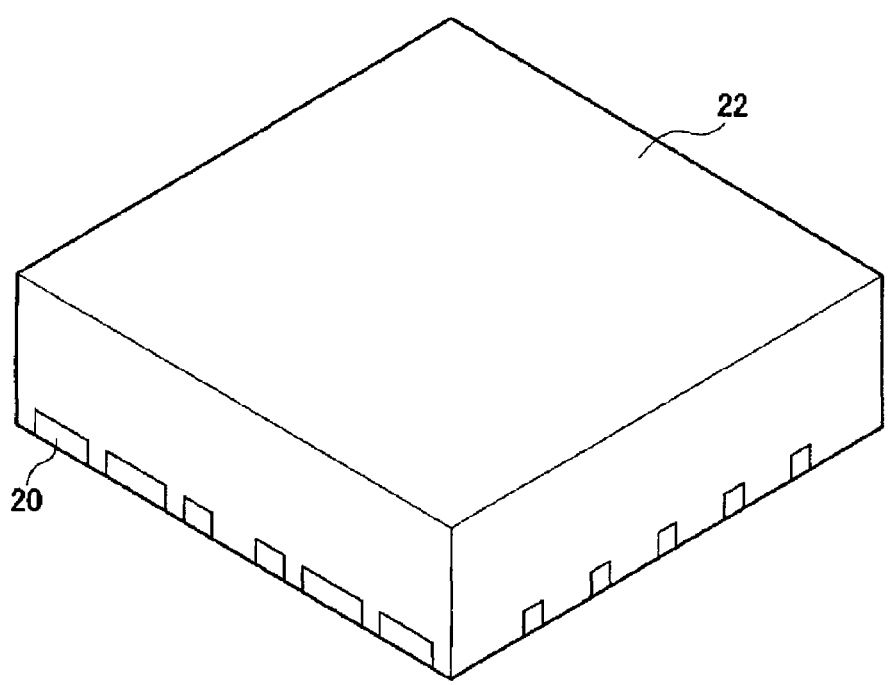
FIGS. 14A and 14B are a perspective view and a bottom view of a package including a semiconductor device according to an embodiment of the present disclosure, respectively.
Figure 14B:
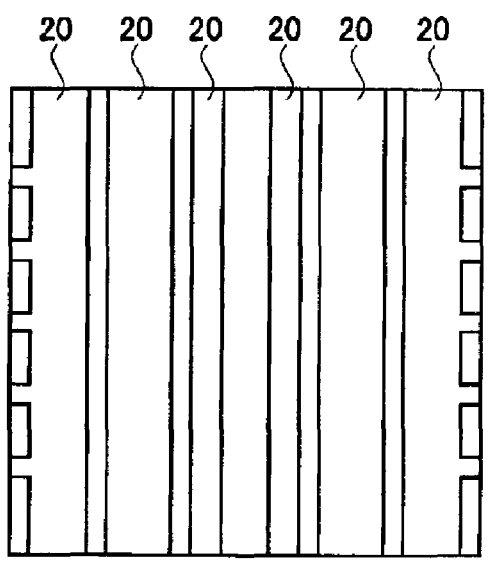

A package including a semiconductor device according to an embodiment of the present disclosure will be now described with reference to FIGS. 14A and 14B. FIG. 14A is a perspective view of a package including a semiconductor device according to an embodiment of the present disclosure, and FIG. 14B is a bottom view of the package.

The package is an example of QFN (Quad Flat No Lead Package) suitable for miniaturization and high integration and can be adopted for portable electronic devices such as smartphones. The outer lead portions of lead frames are also sealed with resin, and terminal electrodes to be soldered to a mounting substrate are formed on the back side of the package as shown in FIG. 14B. Since the terminal electrodes are fixed with resin, they have no deformation during handling and the pitch thereof can be further reduced. The package is not limited to QFN, but may be QFP (Quad Flat Package), SOP (Small Outline Package), TSSOP (Thin Shrink Small Outline Package), SOJ (Small Outlet J-leaded), or the like.

[Applications]

The module and package including the semiconductor device according to the embodiment of the present disclosure can be used for various applications including, for example, industrial equipment such as smartphones, tablet terminals, personal computers, wearable terminals, data terminals, barcode scanners, battery chargers, surveillance cameras, gas alarms, medical devices, healthcare care devices, robots and the like, on-board equipment such as car navigations, engine control units, electric power steering, on-board camera modules and the like, AV equipment such as TVs, home theaters, audios, and the like, home appliances such as air conditioners, refrigerators, rice cookers, hair dryers, and the like, etc. With the use of the semiconductor device according to the embodiments of the present disclosure, it is possible to provide the above-mentioned devices and products with reduced defects and ensured high reliability.

OTHER EMBODIMENTS

Although some embodiments have been described as above, the discussions and drawings that form parts of the present disclosure are illustrative and should not be construed as limitative. From the present disclosure, various alternative embodiments, examples and operational techniques will be apparent to those skilled in the art. Thus, the present disclosure includes various embodiments and the like not described herein.

INDUSTRIAL APPLICABILITY

The semiconductor device and the method of manufacturing the same according to the present disclosure can be used for various semiconductor module technologies such as IGBT modules, diode modules, MOS modules (Si, SiC, GaN, AlN, gallium oxide, and the like), and can be applied to a wide range of industrial fields such as inverter circuit modules that drive electric motors used as power sources for electric automobiles (including hybrid vehicles), trains, industrial robots, and so on, inverter circuit modules that convert power generated by solar cells, wind power generators, and other power generators (especially private power generators) into commercial power, etc.

In addition, the semiconductor device according to the present disclosure can reduce defects due to heat and has excellent heat resistance, and thus can be used for in-vehicle modules that ensure in-vehicle reliability.

According to the present disclosure in some embodiments, it is possible to provide a semiconductor device, which is capable of sufficiently securing the adhesion between a resin and a lead frame without causing voids or solder cracks, a method of manufacturing the same, and a module including the semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a lead frame including:
      a first opening portion, and
      a second opening portion,
         wherein a depth of the second opening portion is smaller than a depth of the first opening portion, and
         wherein the second opening portion is closer to an outer end portion of the lead frame than the first opening portion;
   a resin filled in the first opening portion;
   a semiconductor element electrically connected to the lead frame; and
   a pillar-shaped electrode configured to connect the lead frame to the semiconductor element,
      wherein a side wall surface of the lead frame in the first opening portion has a larger average surface roughness than an upper surface of the lead frame,
      wherein one end of the pillar-shaped electrode faces the lead frame and the other end of the pillar-shaped electrode faces the semiconductor element,
      wherein in a cross-sectional view, both side end portions of the one end of the pillar-shaped electrode are convex arc-shaped portions, respectively, and
      wherein a bottom surface of the one end of the pillar-shaped electrode is formed between both of the convex arc-shaped portions.

2. The semiconductor device of claim 1,
   wherein the first opening portion includes a first region having a first opening width, and a second region having a second opening width smaller than the first opening width, and
   wherein the second region is located above the first region.

3. The semiconductor device of claim 2, wherein the depth of the second opening portion is the same as a depth of the second region.

4. The semiconductor device of claim 1, wherein the second opening portion has a rounded shape.

5. The semiconductor device of claim 1, wherein the second opening portion is formed along an outer end portion of the semiconductor device is in a plan view.

6. The semiconductor device of claim 1, wherein the lead frame is electrically connected to the semiconductor element via the pillar-shaped electrode and a metal layer.

7. The semiconductor device of claim 6, wherein the pillar-shaped electrode includes at least one material selected from the group of copper, nickel, tin, and silver.

8. A module comprising the semiconductor device of claim 1.

9. The semiconductor device of claim 1, wherein an acute angle formed by a tangent line to a point of one of the convex arc-shaped portions and the bottom surface decreases as the point moves away from the bottom surface.

10. A method of manufacturing a semiconductor device, comprising:
    performing roughening treatment on a lead frame including a first opening portion and a second opening portion,
       wherein a depth of the second opening portion is smaller than a depth of the first opening portion, and
       wherein the second opening portion is closer to an outer end portion of the lead frame than the first opening portion;
    forming a pillar, which includes a pillar-shaped electrode, on a semiconductor substrate,
       wherein one end of the pillar-shaped electrode faces the lead frame and the other end of the pillar-shaped electrode faces the semiconductor substrate,
       wherein in a cross-sectional view, both side end portions of the one end of the pillar-shaped electrode are formed of convex arc-shaped portions, respectively, and
       wherein a bottom surface of the one end of the pillar-shaped electrode is formed between both of the convex arc-shaped portions;
    bonding the pillar-shaped electrode to the lead frame; and
    filling the first opening portion with a resin.

11. The method of claim 10, wherein the roughening treatment is performed on a side wall surface of the first opening portion.

12. The method of claim 10, wherein the roughening treatment is performed by a method of applying a roughening solution or a method of immersing in a roughening solution.

13. The method of claim 10,
    wherein the first opening portion includes a first region having a first opening width, and a second region having a second opening width smaller than the first opening width, and wherein the second region is located above the first region.

14. The method of claim 13, wherein the depth of the second opening portion is the same as a depth of the second region.

15. The method of claim 10, wherein the second opening portion has a rounded shape.

16. The method of claim 10, wherein the second opening portion is formed along an outer end portion of the semiconductor device in a plan view.

17. The method of claim 10, wherein the lead frame is electrically connected to a semiconductor element via the pillar-shaped electrode and a metal layer.

18. The method of claim 17, wherein the pillar-shaped electrode includes at least one selected from the group of copper, nickel, tin, and silver.

* * * * *